United States Patent [19]

Yoshida et al.

[11] Patent Number: 5,022,058

[45] Date of Patent: Jun. 4, 1991

[54] TIMING SIGNAL RECOVERY CIRCUIT FOR A DATA TRANSMISSION SYSTEM

[75] Inventors: Atsushi Yoshida, Tokyo; Takanao Suzuki, Shizuoka, both of Japan

[73] Assignee: NEC Corporation, Japan

[21] Appl. No.: 454,276

[22] Filed: Dec. 21, 1989

[30] Foreign Application Priority Data

Dec. 23, 1988 [JP] Japan ................. 63-323715

[51] Int. Cl.⁵ .............................. H03D 3/24
[52] U.S. Cl. .................... 375/120; 331/17; 331/25
[58] Field of Search .............. 375/81, 119, 120; 358/148, 158; 328/133; 331/25, 1 R, 1 A, 17

[56] References Cited

U.S. PATENT DOCUMENTS

| 4,500,857 | 2/1985 | Bosselaers et al. | 332/112 |
| 4,523,150 | 6/1985 | Hogeboom | 328/133 |
| 4,607,296 | 8/1986 | Smidth | 375/120 |
| 4,680,778 | 7/1987 | Krinock | 375/120 |
| 4,712,077 | 12/1987 | Ansell et al. | 331/25 |
| 4,769,704 | 9/1988 | Hirai et al. | 358/158 |
| 4,809,068 | 2/1989 | Nagai | 375/120 |

Primary Examiner—Douglas W. Olms
Assistant Examiner—Stephen Chin
Attorney, Agent, or Firm—Ostrolenk, Faber, Gerb & Soffen

[57] ABSTRACT

A timing signal recovery circuit for recovering a timing signal from a received signal includes a circuit for extracting a timing signal from the received signal; a voltage-controlled oscillator (VCO) to generate a local timing signal; a phase-difference detecting circuit for detecting a phase difference between the extracted timing signal and the local timing signal; a loop filter responsive to the detected phase difference for generating a VCO control voltage supplied to the VCO; and a circuit for controlling the loop filter such that the VCO control voltage remains substantially within a predetermined voltage range. The loop filter control circuit substantially prevents instability of the VCO.

11 Claims, 3 Drawing Sheets

TIMING SIGNAL RECOVERY CIRCUIT FOR A DATA TRANSMISSION SYSTEM

BACKGROUND OF THE INVENTION

The present invention relates to a data transmission system for transmitting data over telephone lines or similar analog lines and, more particularly, to a timing signal recovery circuit associated with a receiver of such a data transmission system.

Usually, the receiver of a data transmission system comprises a timing signal recovery circuit which generates a local timing signal necessary for recovering the transmitted data from a received signal. The conventional timing signal recovery circuit is composed of: a circuit to extract a timing signal from the received signal; a voltage controlled oscillator (VCO) to generate a local timing signal in a receiver; a phase difference detector for detecting the phase difference between the extracted timing signal and the generated local timing signal; and a loop filter for controlling the VCO in response to the detected phase difference. However, the timing signal recovery circuit of the kind has the disadvantage that if the loop filter generates initially a voltage larger than a voltage that can control the VCO, then the VCO may be driven into the uncontrolled condition. This causes in turn that an integrator contained in the loop filter integrate either excessive positive or negative voltage, with the result that the entire system becomes unstable.

SUMMARY OF THE INVENTION

It is therefore an object of the invention to provide a timing signal recovery circuit free from the above-mentioned unstable condition.

According to the present invention, a timing signal recovery circuit of the invention comprises a voltage-controlled oscillator (VCO) for generating a local timing signal in a receiver, and a phase-difference detector for generating a phase difference signal in response to the phase difference between the received signal and the generated local timing signal. The phase difference signal is applied to a loop filter to generate a VCO control signal. In the present invention, a filter control circuit for generating a filter control signal in response to the VCO control signal, is provided in order to prevent the occurrence of the unstable condition of the receiver which may occur when the loop filter generates the VCO control signal. Also, the loop filter comprises a selector for selecting the transfer function of an integrator included in the loop filter in response to the filter control signal. In other words, the filter control circuit controls the selector so as to provide the integrator of the loop filter with zero signal if the absolute value of the output of the loop filter becomes greater than a predetermined value, with the result that the excessive positive or negative voltage is not continuously supplied to the integrator.

BRIEF DESCRIPTION OF THE DRAWINGS

The above and other objects, features and advantages of the present invention will become more apparent from the following detailed description taken with the accompanying drawings in which.

DETAILED DESCRIPTION OF THE PREFERRED EMBODIMENT

Figure 1:
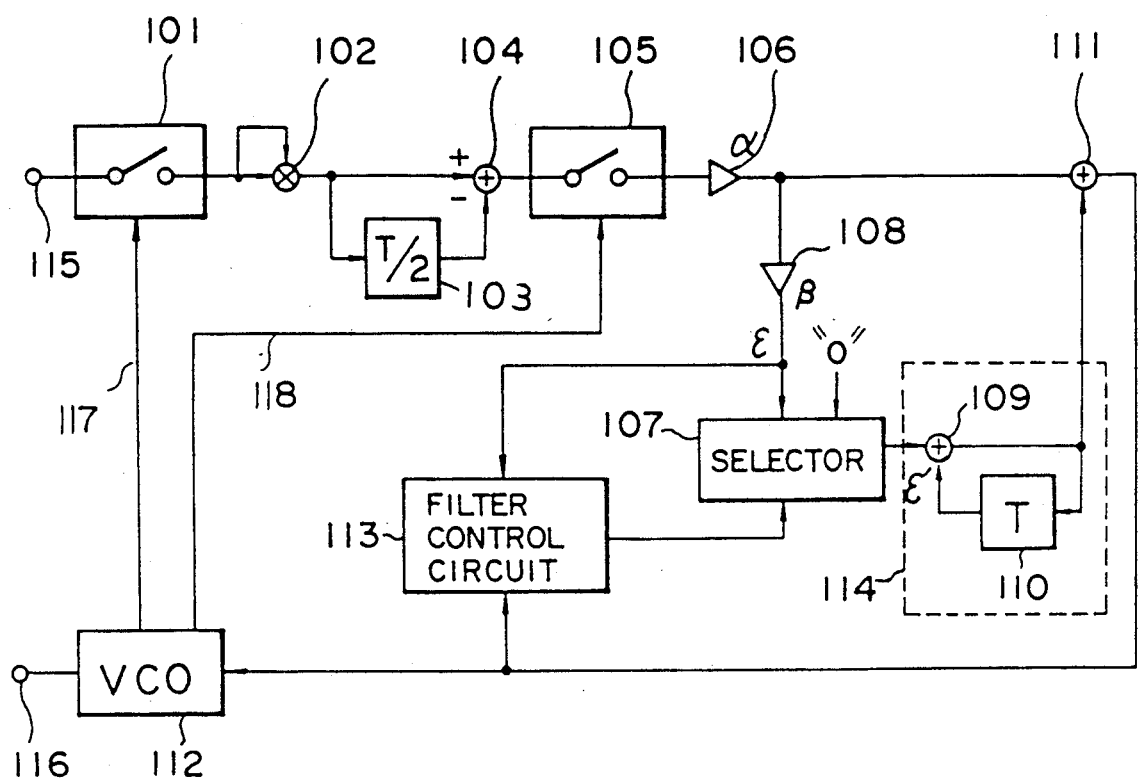
FIG. 1 is a block diagram showing an embodiment of the present invention.
Figure 2A:
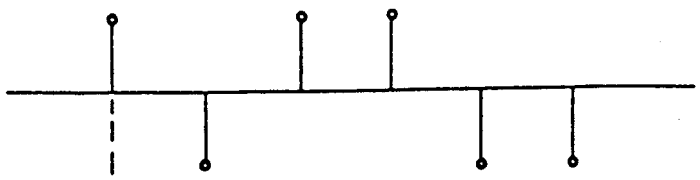
FIGS. 2A to 2F are waveform diagrams for explaining the operation of the circuit shown in FIG. 1.
Figure 2B:
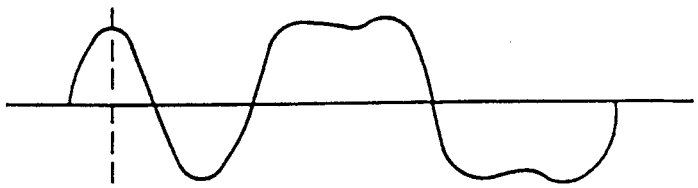

Referring to FIGS. 1 and 2, a received signal shown in FIG. 2B is applied to an input terminal 115. The received signal has a distorted waveform of a PAM signal of its baud-rate 1/T shown in FIG. 2A due to the bandwidth limitation of a transmission line. The PAM signal may be the imaginary or real part of a QAM signal.

Figure 2C:

A first sampler 101 samples the received signal with a sampling clock 117 of its frequency N/T (N: arbitrary integer) supplied from a VCO 112. The train of output sample values has a waveform similar to the received signal, if the clock frequency N/T is sufficiently higher than 1/T. A multiplier 102 squares the sampled values to provide a squared signal as shown in FIG. 2C.

Figure 2D:
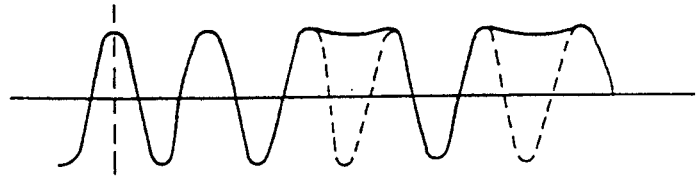
Figure 2E:
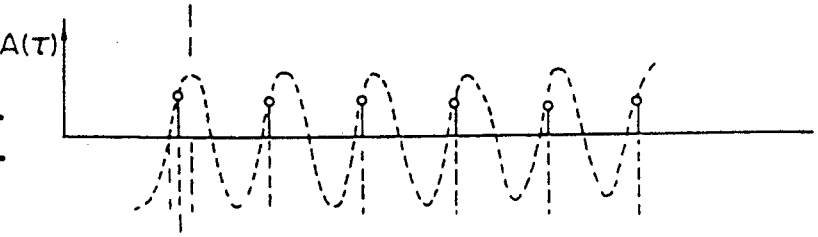
Figure 2F:
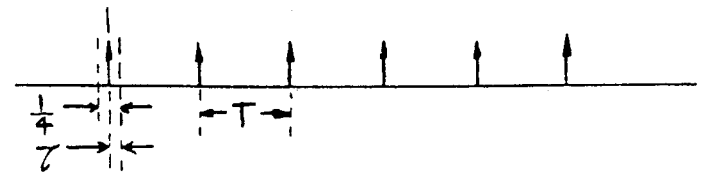

A DC eliminating filter, which is composed of a register 103 and a substracter 104, excludes the DC component from the squared signal to provide a phase-information signal having the repetition frequency 1/T as shown in FIG. 2D. The phase-information signal takes positive peaks at the pulse occurrence points of the PAM signal in FIG. 2A. Therefore, if the frequency and phase of the signal generated at the VCO 112 are made equal to those determined from the peak time points of the phase-information signal, the clock is successfully recovered.

In the embodiment, however, the occurrence points of the recovery clock is controlled to coincide with the zero crossing points, rather than the peak time points, of the phase-information signal. This is because the zero crossing points can be used as the reference of the automatic control. However, it is necessary to shift the recovery clock by $\mp T/4$ after locking it at zero crossing points, since the zero crossing points are shifted by $\mp T/4$ from the peak points of the phase-information signal. Therefore, the recovery clock is at first controlled to coincide its peak with the zero crossing of the phase-information signal and then phase-locked.

In order to phase-lock the recovery clock, a sampled value of the phase-information signal (FIG. 2D) sampled by the recovery clock should be utilized to generate a VCO control signal. A second sampler 105 samples the phase-information signal with a sampling clock 118 shown in FIG. 2F of its frequency 1/T supplied from the VCO 112 to generate a sampled signal A ($\tau$) shown in FIG. 2E.

As described later, the sampling clock 118 is a recovered timing signal when the phase-information from second sampler 105 becomes zero. As long as the occurrence time point of the recovery clock coincides with the zero crossing point of the phase-information signal, the sampled signal is equal to zero. If the phase of the recovery clock is different from that of the phase-information signal, the sampled signal becomes non-zero. Depending on the phase difference between the recovery clock and the phase-information signal, the sign and magnitude of the sampled signal is determined, that is, it represents the relative phase of the recovery clock to the zero crossing point of the phase-information signal.

By feeding back the sampled signal to the VCO 112 through a loop filter, the phase synchronization can be attained.

The loop filter comprises first and second coefficient multipliers 106 and 108, an integrator 114 containing an adder 109 and a delay unit 110, and an adder 111 to add the output of the integrator 114 to the output of the first coefficient multiplier 106 to generate a VCO control signal. In addition, the loop filter comprises a selector 107, which supplies selectively the integrator 114 with either the output of the second coefficient multiplier 108 or "0" signal, in response to a filter control signal supplied from a filter control circuit 113. When the selector 107 of the loop filter selects the output of the second coefficient multiplier 108, the transfer function $H_1(s)$ of the loop filter is given by $$H_1(s) = 1 + \beta/s,$$

where $\beta$ and $1/s$ (s denotes the differential operator) denote the coefficient of the second coefficient multiplier 108 and the transfer function of the integrator 114, respectively. On the other hand, when the selector 107 selects the "0", the transfer function $H_2$ of the loop filter is given by $$H_2 = 1.$$

The VCO control signal is also applied to a filter control circuit 113 which generates the filter control signal to control the selector 107. The control circuit 113 operates according to the following rules:

(I) For $-V \leq V_c \leq +V$ (normal condition);

$$\epsilon' = \epsilon.$$

(II) For $V_c > +V$ (inhibition of the integrated value increasing);

$$\begin{aligned}\epsilon' &= \epsilon(\epsilon < 0), \\ &= 0(\epsilon \geq 0).\end{aligned}$$

The output frequency of the VCO is fixed to $f_c - \Delta f$.

(III) For $V_c < -V$ (inhibition of the integrated value decreasing);

$$\begin{aligned}\epsilon' &= \epsilon(\epsilon \geq 0), \\ &= 0(\epsilon < 0).\end{aligned}$$

The output frequency of the VCO is fixed to $f_c + \Delta f$.

Figure 4:
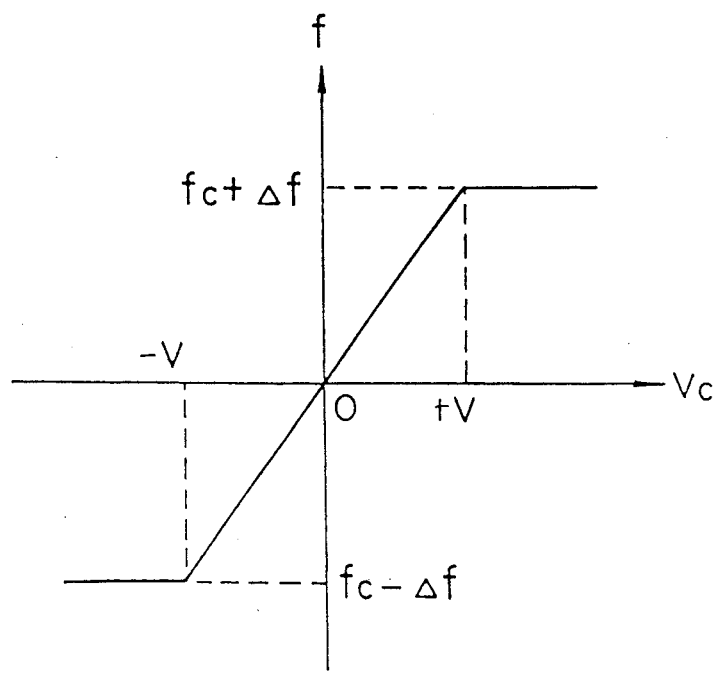
FIG. 4 is a characteristic diagram showing the relation between the input voltage and the output frequency of the VCO.

The symbols $\epsilon$ and $\epsilon'$ denote the output signal of the second coefficient multiplier 108 and the input of the integrator 114, respectively. The control characteristics of the VCO 112 are plotted in FIG. 4, which shows threshold values $+V$ and $-V$. Thus, if the VCO control signal is greater than the positive threshold value $+V$, the input of the integrator 114 is inhibited to increase, while it is inhibited to decrease, if the VCO control signal is smaller than the negative threshold value $-V$. Consequently, the possibility of the loop filter becoming unstable is excluded.

Figure 3:
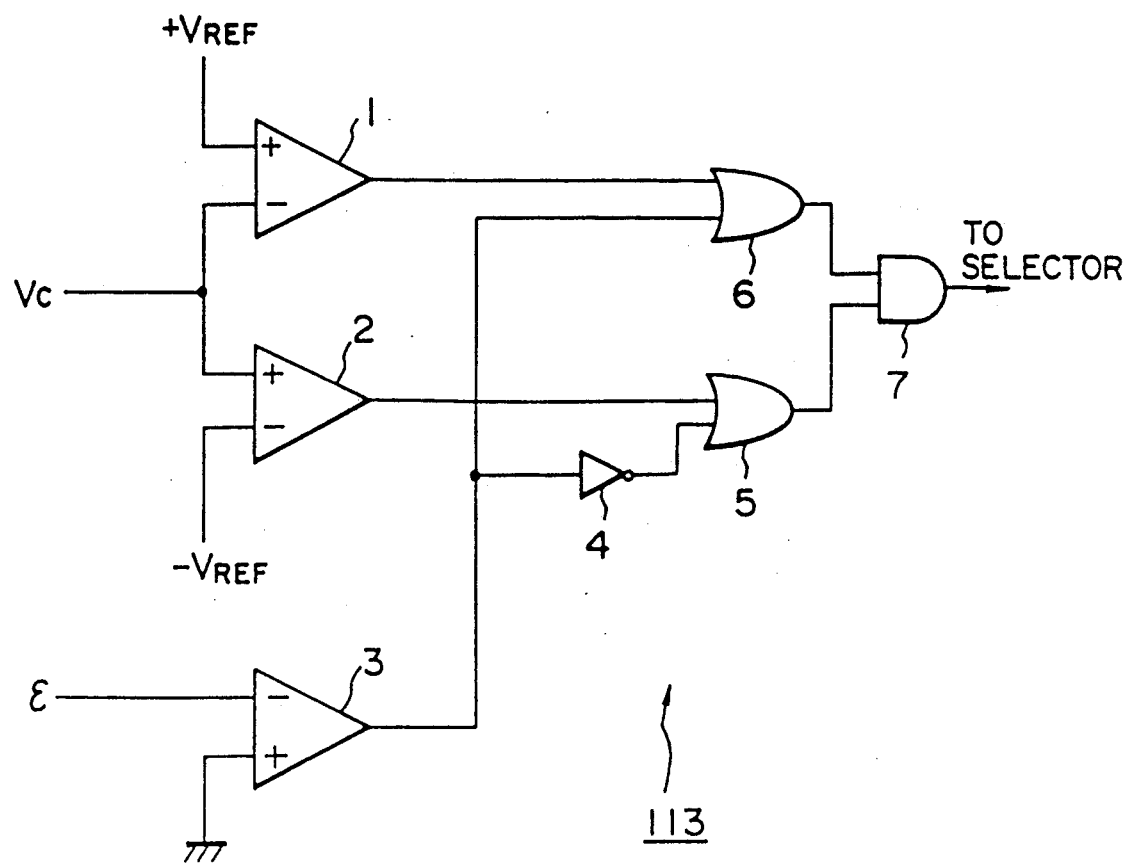
FIG. 3 is a block diagram showing the detail of the filter control circuit shown in FIG. 1.

In FIG. 3 which is a block diagram showing the detail of the filter control circuit 113 in FIG. 1, the control circuit 113 comprises first and the second comparators 1 and 2 for comparing the VCO control voltage $V_c$ with the reference voltages $+V$ and $-V$, respectively, a third comparator 3 for detecting whether the output $\epsilon$ of the coefficient multiplier 108 is positive or negative, and logical circuits 4 to 6 for generating a selector control signal in response to the comparison results of the comparators 1 to 3.

As is explained above, the present invention has an advantage of preventing the loop filter from entering the unstable condition by inhibiting the integration process of the integrator in the loop filter of the timing signal recovery circuit, depending on the status of the VCO control voltage.

Although a specific embodiment of the invention has been described herein, the appended claims are not to be construed as limited to such embodiment, but rather should be construed to include all modifications and variations that are fairly within the teachings set forth herein.

What is claimed is:

1. A timing signal recovery circuit comprising:
   local timing signal generator means for generating a local timing signal;
   phase-difference detector means for generating a phase-difference signal $V_i$ representing the phase-difference between a timing signal having the baud-rate of a received signal and said local timing signal;
   loop filter means having two transfer functions $H_1(s)$ and $H_2(s)$ for generating a control voltage $V_c$ to control the phase of said local timing signal by smoothing said phase-difference signal $V_i$ by means of a selected one of said two transfer functions; and
   control means for generating a selection signal to select one of said two transfer functions of said loop filter in response to said control voltage $V_c$ and said phase-difference signal $V_i$.

2. A timing signal recovery circuit as claimed in claim 1, wherein said two transfer functions $H_1(s)$ and $H_2(s)$ are given by, $$H_1(s) = 1 + \beta/s,$$

and $$H_2(s) = 1.$$

respectively, where $\beta$ and s denote the coefficient of a coefficient multiplier comprised in said loop filter and the differential operator, respectively.

3. A timing signal recovery circuit as claimed in claim 1, wherein said local timing signal generator means is composed of a voltage controlled oscillator circuit; and
   wherein the frequency of said local timing signal is proportional to said control voltage $V_c$ when said voltage $V_c$ is greater than or equal to a first reference voltage $V_1$ and smaller than or equal to a second reference voltage $V_2$ which is greater than said voltage $V_1$, while it is fixed to a first frequency $f_1$ when said voltage $V_c$ is smaller than said first voltage $V_1$ and it is fixed to a second frequency $f_2$ when said voltage $V_c$ is greater than said second voltage $V_2$.

4. A timing signal recovery circuit as claimed in claim 1, wherein said control means selects:
   (1) said first transfer function when $V_1 \leq V_c \leq V_2$;
   (2) said second transfer function when $V_c < V_1$ and $V_i < 0$;
   (3) said first transfer function when $V_c < V_1$ and $V_i \geq 0$;

(4) said second transfer function when $V_c > V_2$ and $V_i > 0$; and
(5) said first transfer function when $V_c > V_2$ and $V_i \leq 0$;
wherein $V_1$ is a first reference voltage and $V_2$ is a second reference voltage.

5. A timing signal recovery circuit for recovering a timing signal from a received signal, comprising:
  local timing signal generator means comprising a voltage-controlled oscillator (VCO) for generating a local timing signal;
  phase-difference detector means for generating a phase difference signal representative of a phase difference between the received signal and the local timing signal;
  loop filter means responsive to the phase difference signal for generating a VCO control signal which is supplied to said VCO, and
  said loop filter means comprising selector means which receives a filter control signal and selects a transfer function of the loop filter in response to the filter control signal;
  filter control circuit means responsive to said VCO control signal for generating said filter control signal which controls said loop filter means, such that said VCO control signal remains substantially within a predetermined voltage range, whereby instability of said VCO is substantially prevented.

6. A timing signal recovery circuit as claimed in claim 5, wherein said loop filter means comprises an integrator and the selector means selects a transfer function of said integrator in response to the filter control signal.

7. A timing signal recovery circuit as claimed in claim 6, wherein said selector means supplies said integrator with substantially zero signal if the absolute value of the VCO control signal becomes substantially greater than a predetermined maximum value.

8. A timing signal recovery circuit as claimed in claim 5, wherein
  the loop filter means has two transfer functions $H_1(s)$ and $H_2(s)$ for generating a control voltage $V_c$ to control the phase of said local timing signal by smoothing said phase-difference signal $V_i$ by selecting the selected one of said two transfer functions; and
  the selector means selects the selected one of said two transfer functions of said loop filter means in response to said control voltage $V_c$ and said phase-difference signal $V_i$.

9. A timing signal recovery circuit as claimed in claim 8, wherein said two transfer functions $H_1(s)$ and $H_2(s)$ are given by $$H_1(s) = 1 + \beta/s,$$

and $$H_2(s) = 1.$$

respectively, where $\beta$ and s denote the coefficient of a coefficient multiplier comprised in said loop filter means and the differential operator, respectively.

10. A timing signal recovery circuit as claimed in claim 8, wherein the frequency of said local timing signal is proportional to said control voltage $V_c$ when said voltage $V_c$ is greater than or equal to a first reference voltage $V_1$ and smaller than or equal to a second reference voltage $V_2$ which is greater than said voltage $V_1$; it is fixed to a first frequency $f_1$ when said voltage $V_c$ is smaller than said first voltage $V_1$; and it is fixed to a second frequency $f_2$ when said voltage $V_c$ is greater than said second voltage $V_2$.

11. A timing signal recovery circuit as claimed in claim 8, wherein said filter control circuit means selects:
  (1) said first transfer function when $V_1 \leq V_c \leq V_2$;
  (2) said second transfer function when $V_c < V_1$ and $V_i < 0$;
  (3) said first transfer function when $V_c < V_1$ and $V_i \geq 0$;
  (4) said second transfer function when $V_c > V_2$ and $V_i > 0$; and
  (5) said first transfer function when $V_c > V_2$ and $V_i \leq 0$;
  wherein $V_1$ is a first reference voltage and $V_2$ is a second reference voltage.

* * * * *